United States Patent [19]

Javan

[11] 4,041,475
[45] Aug. 9, 1977

[54] COMPUTER MEMORY

[75] Inventor: Ali Javan, Cambridge, Mass.

[73] Assignee: Massachusetts Institute of Technology, Cambridge, Mass.

[21] Appl. No.: 596,208

[22] Filed: July 16, 1975

[51] Int. Cl.² .............................................. G11C 11/34
[52] U.S. Cl. .................... 340/173 LS; 250/211 J; 307/238; 307/312; 340/173 LT
[58] Field of Search .............. 340/173 LT, 173 LS, 340/173 R; 307/238; 250/211 J

[56] References Cited

U.S. PATENT DOCUMENTS

| 3,116,474 | 12/1963 | Smith et al. | 340/173 LS |
| 3,149,311 | 9/1964 | Hyman et al. | 340/173 LS |
| 3,443,166 | 5/1969 | Ing et al. | 340/173 LS |
| 3,505,527 | 4/1970 | Slana | 340/173 LS |
| 3,623,026 | 11/1971 | Engeler et al. | 340/173 LS |

*Primary Examiner*—David L. Trafton
*Attorney, Agent, or Firm*—Arthur A. Smith, Jr.; Robert Shaw; John Noel Williams

[57] ABSTRACT

A memory system is shown in which communication to and from memory cells is effected by optical beams. Memory cells are shown employing elements with negative resistance and operating in either of two stable modes. Other memory cells are shown employing subharmonic oscillators operating in either of two phase relationships. The memory cells and systems permit extremely fast operation.

5 Claims, 14 Drawing Figures

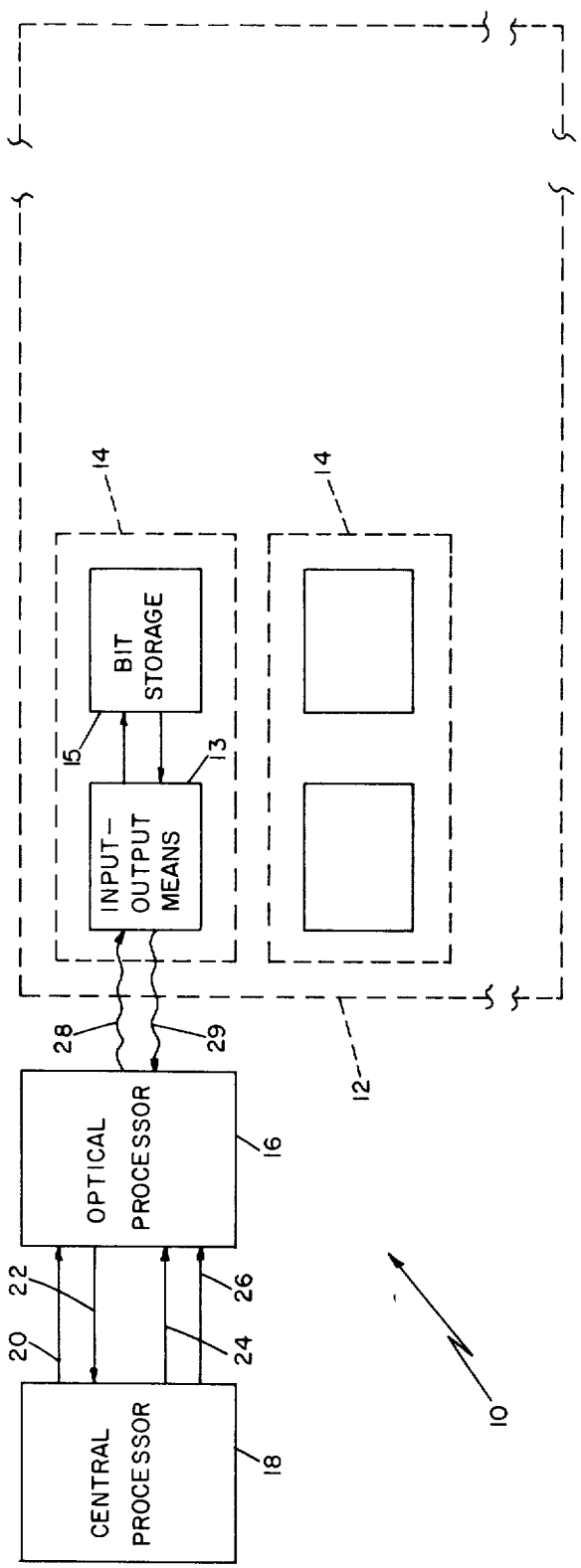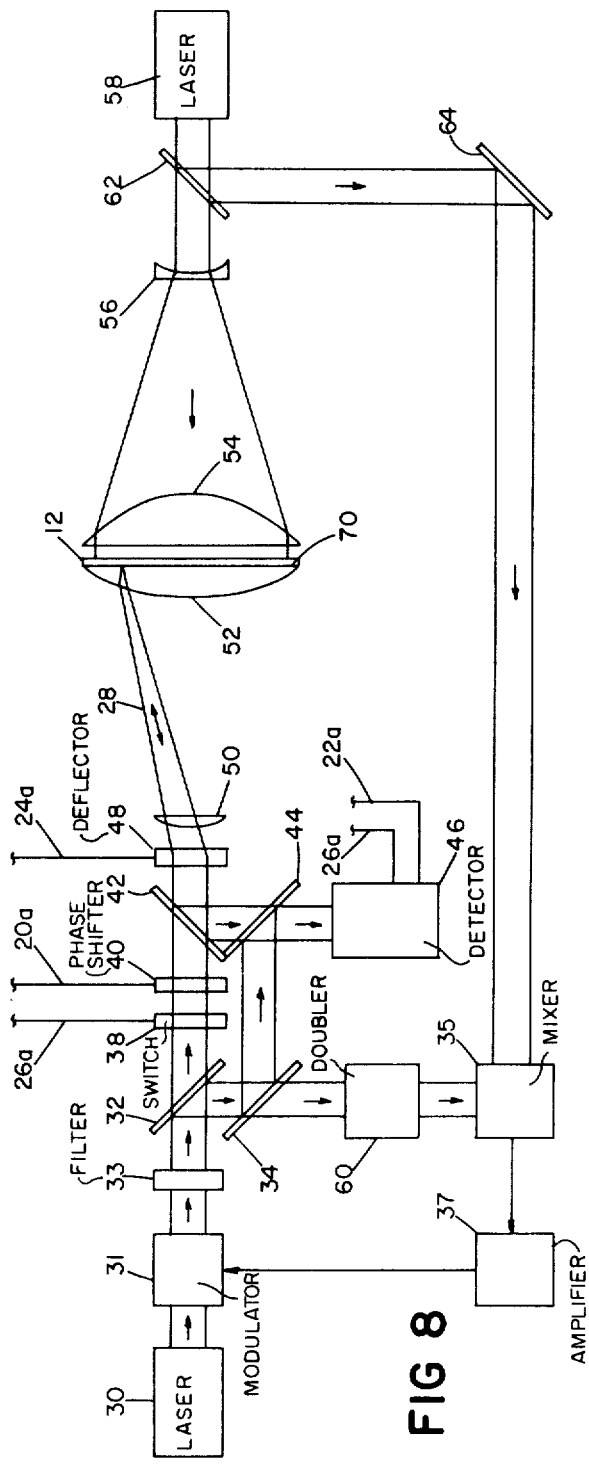

COMPUTER MEMORY

ACKNOWLEDGEMENT

The invention herein described was made in the course of work performed under contract with the Department of the Air Force, Electronic Systems Division and under contract with the Department of the Navy.

BACKGROUND OF THE INVENTION

This invention relates to memories as used in computers for storing data.

There is a continuing demand in the computer art for faster operation, and one limitation to achieving this has been the time required to enter and recover information stored in memories. In present memories, the time to transmit signals for read-in, read-out, and interrogation along leads between a processor and memory cells make a significant contribution to memory operating time.

Summary of the Invention

The invention concerns a memory systems having an assembly of memory cells with identifying address values, each cell capable of assuming alternatively either of two states, the states defining the value of information stored in the cell.

The invention features communication between a processor and individual cells by beams of optical radiation, where the term "optical " is used to designate electromagnetic radiation in the infra-red visible and ultraviolet portions of the spectrum which is usually manipulated by optical devices such as lenses, prisms and such. The invention features an array of memory cells arranged on a substrate in accordance with identifying address values, each cell comprising electrical circuitry having two alternative stable states, and input-output means, connected to said circuitry, said means being responsive to incident optical radiation having one of two distinct characterizations, and producing one of two electrical effects in correspondence thereto. The input-output means is also responsive to the operating state of the circuitry to emit radiation indicating the operating state thereof. The circuitry of each memory cell is arranged and connected so that when the input-output means is stimulated by optical radiation having the first of the two distinct characterizations the circuitry assumes the first operating state and when the input-output means is stimulated by optical radiation of the second characterization the circuitry assumes the second operating state. The memory system may further include an optical processor arranged to send optical radiation to and receive radiation from the array, the processor having a data input, a data output, and an address input. The processor operates in a write-in mode generating a beam of optical radiation directed selectively to the one of the memory cells corresponding to the value of an addressing signal received on its address input, the radiation of this beam having one of two distinctive characterizations corresponding to the value of a data bit signal received on the data input. The processor also includes a radiation receiver arranged to operate in a read-out mode responding selectively to radiation from the one of the memory cells corresponding to the value of an addressing signal received on the address input and to emit on the data output an electrical signal of value corresponding to the characterization of the radiation received from the memory cell.

Specific embodiments of the invention may further include a lens system focussing optical radiation on a selected one of said cells; supporting said array on a surface of a lens of said lens system; means for providing operating power for said cells transmitted thereto by optical radiation; a substrate transparent to said incident optical radiation, with the operating power radiation and the radiation of two characterizations being incident on opposite sides of said memory array.

A specific embodiment of the invention features an element with a negative resistance characteristic connected to a load resistor to operate stably alternatively at either of two points of its characteristic and a radiation processor arranged to send directionally-controlled optical radiation to and receive radiation from an array of memory cells, the processor having data input, data output, and address input. The processor operates in a write-in mode generating a beam of optical radiation directed selectively to the one of said cells corresponding to the value of an address signal received on its address input, the radiation of this beam having two distinctive alternative characterizations corresponding to the value of a data signal received on the data input. The processor also includes a radiation receiver arranged to operate in a read-out mode responding selectively to radiation from the one of the memory cells corresponding to the addressing signal received and to emit on an electrical signal of value corresponding to the characterization of the received radiation. The optical processor also includes directing means to direct radiation selectively to at least two distinct areas of each of said cells, corresponding to two values of a data signal received by said processor. The memory cells feature two light sensing devices spaced from one another by a distance to avoid diffractive interaction, the first effecting switching the cell circuitry to a first operating point and the second of said devices effecting switching the circuitry to the second operating point.

The invention advantageously provides a memory system operating with very short access times because the transmission of information to and from the memory is accomplished with radiation beams. The transmission accordingly takes place at the speed of light, so that transmission time will be in sub-nanosecond times when distances between memory cells and radiation processor are a few inches and with closer spacing may be made no more than picoseconds.

BRIEF DESCRIPTION OF THE DRAWING

FIG. 1 shows, in block diagram form, a memory system according to the invention.

FIG. 8 shows details of an alternative embodiment of the system of FIG. 1.

Description of Embodiments

Figure 10:
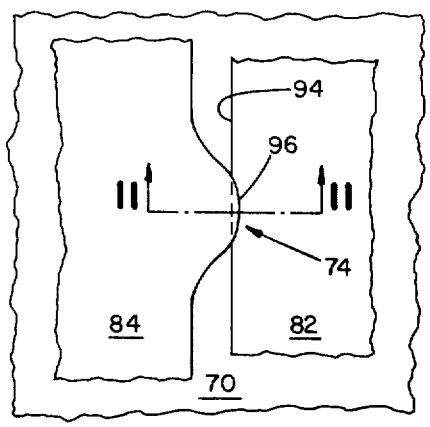
FIGS. 10 and 11 show further details of the junction of FIG. 9.

Referring to FIG. 1, memory system 10, according to the invention, includes radiation processor 16, connected to central processor 18 of a computer through electrical data input channel 20, electrical data output channel 22, electrical address input channel 24, and timing channel 26. Memory system 10 includes memory bank 12 with cells 14 arranged in an array on a substrate, each cell 14 storing one bit of information and having an identifying address value. Each cell 14 includes input-output means 13 receiving and emitting radiation and electrical circuitry storing a bit of information. Processor 16 and memory bank 12 communicate through beam 28 traveling from radiation processor 16 to memory bank 12 and beam 29 traveling in the reverse direction.

The general features of the invention shown in FIG. 1 are equally applicable to any of several embodiments to be described. Elements identified in FIG. 1 correspond to elements in the several embodiments identified by a like numeral but having an additional identifying letter.

Figure 2:
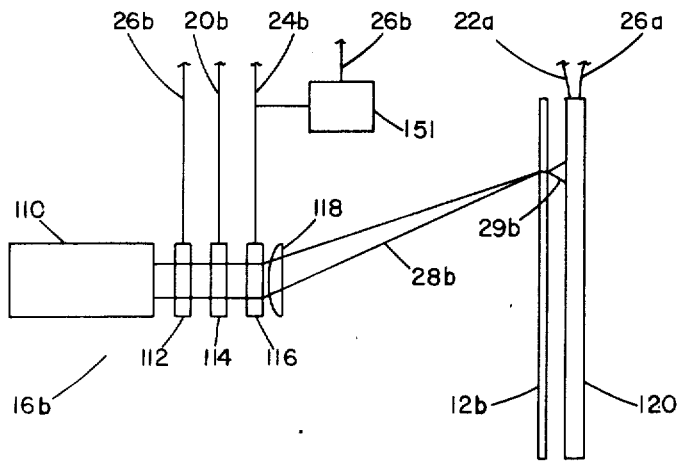
FIG. 2 shows a first embodiment of the system of FIG. 1.
Figure 3:
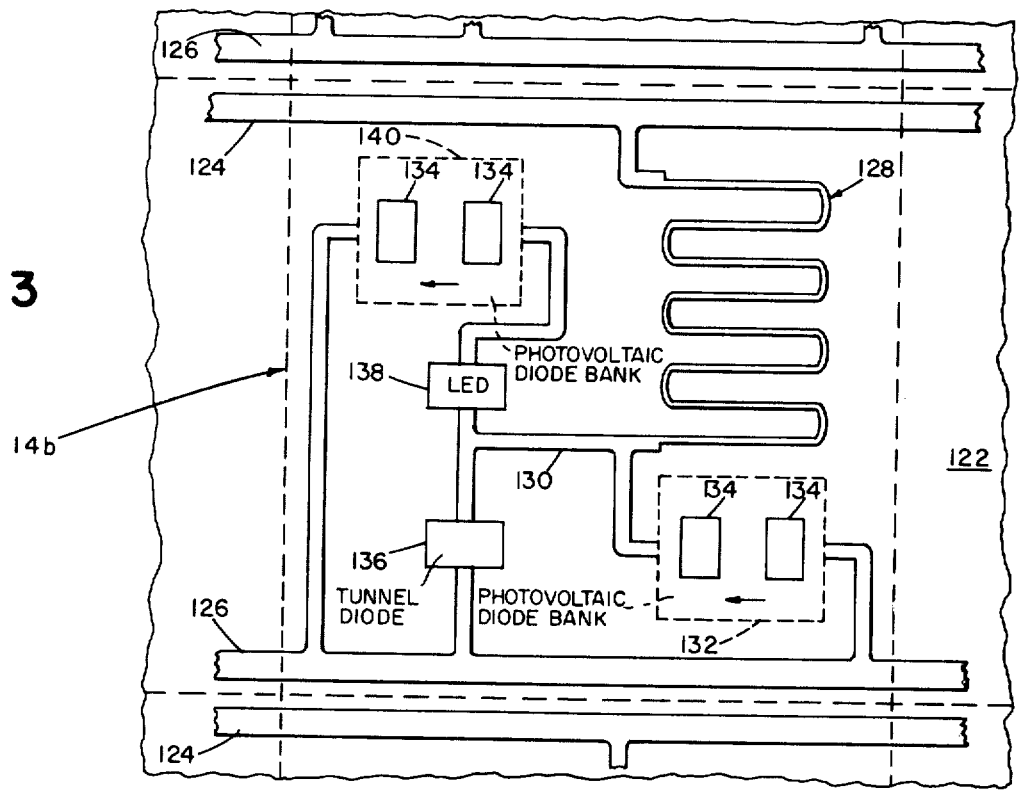
FIG. 3 shows details of a memory cell included in the embodiment of FIG. 2.
Figure 4:
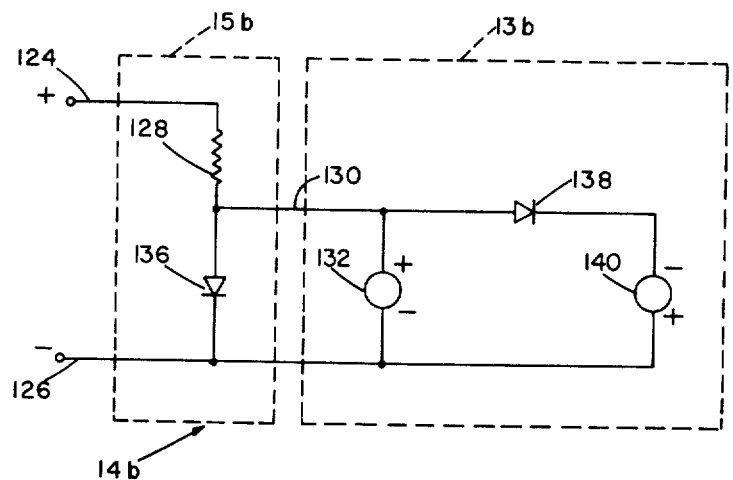
FIG. 4 shows schematically the circuitry of FIG. 3.

In an embodiment of the invention shown more particularly in FIG. 2 and 3, argon laser 110, emitting at about 500 nm, directs its output beam through optical switch 112, connected to control channel 26b, through deviator 114, connected to data input channel 20b, through addressing deflector 116, connected to address input channel 24b, onto memory bank 12b, along beam 28b. Optical switch 112, deviator 114, and address deflector 116 are electro optical devices of well-known design. The optical switch may advantageously be a Kerr cell; the deviator and address deflector may employ potassium dihydrogen phosphate prisms to achieve variable deflections. Memory bank 12b includes an array of addressed memory cells 14b on a substrate. Radiation sensor 120 which is a part of radiation processor 16b, is supported close to memory bank 12b on the opposite side from laser 110, in position to receive light from cells 14b of memory bank 12b.

Turning now to FIG. 3, individual memory cell 14b includes a number of circuit elements supported on substrate 122. Positive buss 124 lies along one edge of the cell while negative buss 126 lies along the opposite edge, the two busses being connected to a power supply (not shown) and supplying the operating power for the cell. Load resistor 128, made by a deposit of conductive material on substrate 122 is connected at one end to buss 124 and at its other to distribution point 130, also made by a conductive deposit. Photovoltaic diode bank 132 with two photovoltaic diodes 134 in series is connected between distribution point 130 and negative buss 126. Tunnel diode 136 or other device with a negative resistance characteristic is connected in parallel with bank 132 between distribution point 130 and negative buss 126. Light emitting diode 138 is connected in series with photovoltaic bank 140 between distribution point 130 and negative buss 126.

Figure 5:
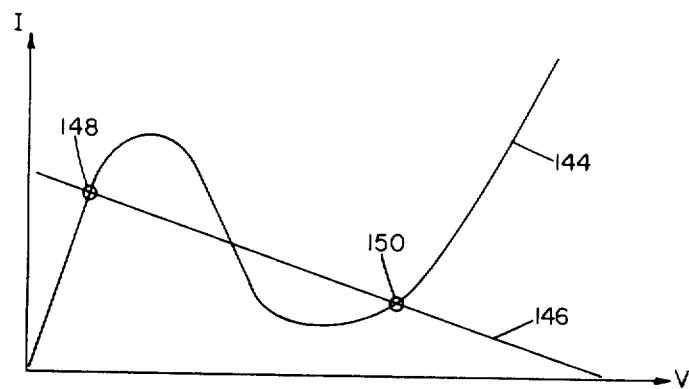
FIG. 5 shows the current-voltage characteristic of a component of the cell of FIG. 2.

The explanation of the operation of the first embodiment is facilitated by first considering the individual cell of the memory. Tunnel diode 136 has a current voltage characteristic 144 as sketched in FIG. 5. The resistance of resistor 128 is adjusted to provide a load line 146.

There are consequently two stable operating states for the cell circuitry corresponding to intersections at point 148 and at point 150. Operation in one of these stable states will be taken as storing a 0 in the cell while operation in the other will be taken as storing a 1. When light from processor 16b is directed (as will be explained hereafter) on photovoltaic bank 132, currents are generated driving diode 136 to operate at the right of its characteristic curve. With extinction of the incident light the circuit and thus the cell settles to operating point 150.

If, alternatively, light is directed onto photovoltaic bank 140, currents are generated driving diode 136 to operate at the left portion of its characteristic curve and, after extinction of the light, settle at operating point 148 thus switching the cell to operating point 148. Additionally, if diode 136 is initially at operating point 150 when light is directed onto bank 140, the voltage across light emitting diode 138 exceeds its threshold for emission and diode 138 emits a burst of light during the switching transient. It may be noted that no light is emitted by diode 138 if tunnel diode is initially operating at point 148, since the voltage across diode 138 never in these circumstances rises over the emission threshold. From the foregoing, it may be seen that photovoltaic banks 132, 140 and light emitting diode 138 provide an input-output means switching the operating state of diode 136 in accordance with the focal portion of the incident light as directed alternatively on the area of bank 132 or 140, and emitting radiation indicating the operating state of the circuitry.

Considering now the operation of the optical processor 16b, a beam from laser 110 after passing through control switch 112 and deviator 114 is deflected by deflector 116 and focused on a specific memory cell in response to the address input signal transmitted on address channel 24b in essentially the same manner as described in connection with the first embodiment. In passing through the optical system, however, the beam is given a small additional deviation in direction by deviator 114 which in response to the data signal from channel 20b deviates the beam from the center of the addressed memory cell 14b alternatively to focus on either photovoltaic bank 132 or bank 140. The beam thus has as its characterization one of two deviations corresponding to the value of a data bit signal received on data input 20b.

Read-out of the memory employs an interrogation technique and is accomplished by directing a beam in the manner described onto bank 140 of an addressed cell. The incident light will cause emission of light from diode 138 only if the tunnel diode 136 was initially in the operating state of point 150, and the sensing by detector 120 of the presence or absence of this light flash provides a data output signal on channel 22b indicating the initial operating state of the cell and by inference the value of the stored bit. Since after an interrogation, a cell is left invariably in operating state 148, it is necessary to reswitch the cell if it was originally in state 150 and it is desired that the cell resume its original state after the data extraction. Means 151, which may be incorporated in the central processor, implements this rewrite in accordance with well-known programs. The central processor transmits operating control signals to optical processor 16b on control channels 26b which impose an orderly sequence on the system and prevent confusion during slewing and switching transients.

Figure 6:
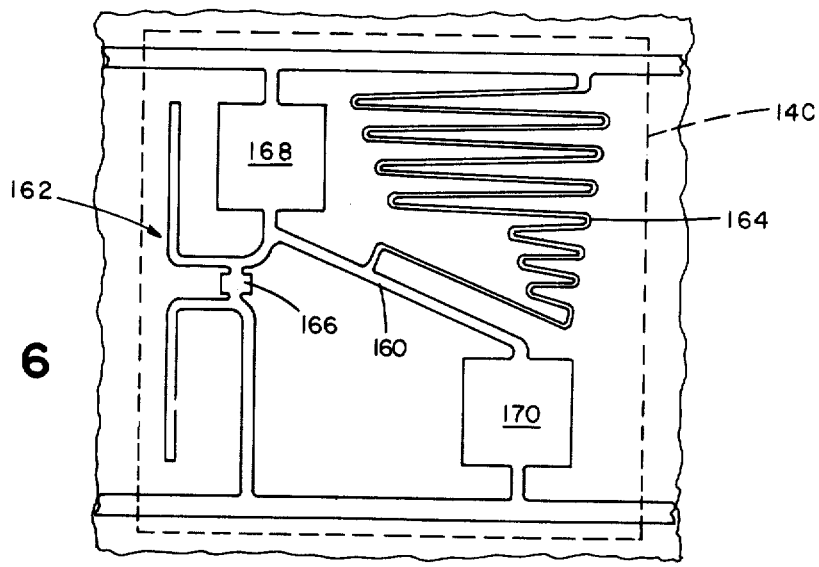
FIGS. 6 and 7 show an alternative memory cell of the embodiment of FIG. 2.
Figure 7:
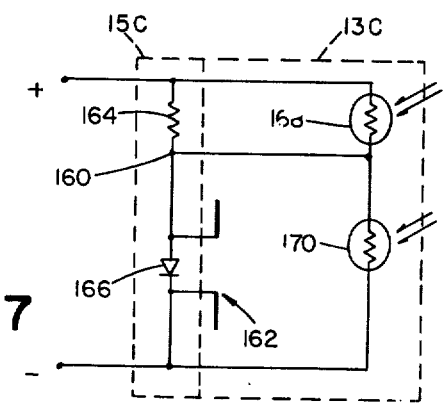

An alternative embodiment, the memory cell 14c of which is shown laid out in FIG. 6 and schematically in FIG. 7, includes bit storage circuitry 15c with load resistor 164 and tunnel diode 166 connected at distribution point 160 and operating in series across a voltage supply in essentially the same manner as bit storage circuitry 14b of the first embodiment. Input-output means 13c includes photoconductive devices 168 and 170, and dipole antenna 12 connected as shown in FIG. 6. The connections and components of the cell may advantageously be formed by a succession of deposits on the non-conductive cell substrate. The radiation processor for use with the memory cell of FIG. 6 is essentially the same as that for the memory cell of FIG. 3 with the deviator having the capability in response to appropriate signals from the central processor directing the light beam selectively to either of the two photoconductive devices on an addressed cell.

The write-in operation of the embodiment of FIG. 6 is as follows. A momentary light beam directed by the optical processor onto photoconductive device 168 causes an increase in the voltage across diode 166 and coerces it into its high voltage state 150; a momentary beam directed onto photoconductive device 170 causes a decrease in the voltage across diode 166 and coerces it into its low voltage state 148. As discussed before, once coerced into a state the resistor 164-diode 166 circuit remains in that state when the coercing beam is switched off.

The read-out operation is implemented by interrogation. An interrogation beam is directed to device 168 in the same manner as when coercing the circuit to operating state 150. If, prior to this interrogation, the circuit is operating in state 148, it switches to state 150 and this switching is accompanied by a switching transient which stimulates antenna 162 to radiate. The radiation from antenna 162 is detected by detector 120, which thereupon sends a signal indicating that the cell had been in state 148 with the corresponding value of data stored therein.

If, on the other hand, prior to interrogation the cell was in operating state 150, no switching transient is generated and the absence of an output from the antenna is interpreted as indicating the cell had been in state 150. Since the interrogation invariably places an interrogated cell in state 150, it is necessary to rewrite the originally stored information bit if it is to be preserved.

Figure 7A:
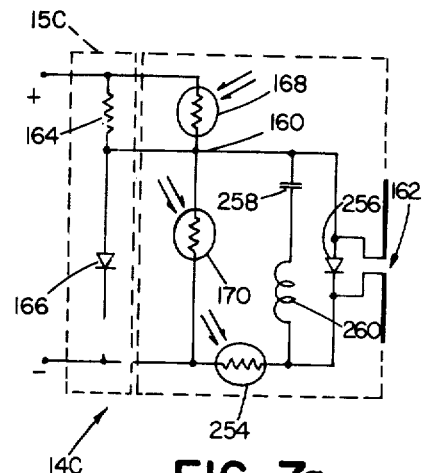
FIG. 7a shows an alternative read-out for the embodiment of FIGS. 6 and 7.

An alternative read-out is shown schematically in FIG. 7a, with load resistor, tunnel diode, antenna and switching photoconductive devices connected in the same way as previously described. Photoconductive devices 254, capacitor 258, inductor 260, tunnel diode 256 with smaller capacitance then diode 166, are connected as shown in FIG. 7a. The optical processor for use with the memory cell of FIG. 7a is essentially the same as that for the memory cell of FIG. 6 and 7 except that the deviator has the capability to assume three configurations in response to appropriate signals from the central processor directing the light beam selectively to any of the three photoconductive devices on an addressed cell.

The read-out operation is implemented by directing a beam onto photoconductive device 254. With the resistance of device 254 reduced by the incident light, the circuitry consisting of device 254, capacitor 258, inductor 260 and tunnel diode 256 oscillates as a negative resistance oscillator provided the voltage at distribution point 160 corresponds to the high-voltage operating mode of diode 166. If, however, the voltage at point 160 corresponds to the low-voltage operating state of diode 166, it is insufficient to cause oscillations of the circuitry. Antenna 162 is sized to resonate with the oscillations and radiate during oscillations. The detector of the optical processor senses the radiation from antenna 162 and transmits a corresponding signal to the central processor indicating the state of the cell interrogated. It may be noted that in the embodiment just described no rewrite is required.

Referring now to FIG. 8, showing details of a third embodiment, the optical processor includes $CO_2$ laser 30, operating at a frequency which it will be convenient to designate $f'$ with a wavelength of about 10 um. The output beam from laser 30 passes through a side band modulator 31, advantageously a gallium arsenide crystal and a narrow band filter 33 passing preferentially one side band at frequency $f$ (which is the subharmonic of laser 58 and maintains phase coherence with that laser. This concept is included in U.S. Pat. No. 3,719,822.) and then passes through beam splitter 32, through optical switch 38, advantageously a Kerr cell, then through electro optical phase shifter 40, advantageously employing a gallium arsenide (or cadmium telluride) crystal, through beam splitter 42, then through address deflector 48, advantageously a pair of gallium arsenide prisms set at right angles to achieve independent deflection in two dimensions, then through focusing lens 50 and normalizing lens 52, and impinges upon a selected cell of memory bank 12a. Normalizing lens 52 is made of sapphire with a flat back surface providing the substrate 70 on which the cells of memory bank 12a are deposited as will be described hereafter. A return beam from memory bank 12a after passing through normalizing lens 52, focusing lens 50 and deflector 48 is diverted in part by beam splitter 42 and, after passing through beam splitter 44, is directed into detector 46. A fraction of the output beam of laser 30 as modulated by modulator 31 and filter 33 is deflected through beam splitter 32, beam splitter 34, and beam splitter 44 into detector 46. Another fraction of the output beam from filter 33 is deflected by beam splitter 32, passes through beam splitter 34 and is directed into frequency doubler 60. The output of doubler 60 is mixed with radiation from CO laser 58 operating at frequency $2f$ (i.e. wavelength about 5um), by way of beam splitter 62 and mirror 64. The mixer 35 output is part of a phase locked loop amplifier 37 driving the crystal modulator 31. The output of laser 58 which passes through dispersing lens 56, normalizing lens 54, and is incident upon all cells of memory bank 12a. Data input channel 20a connects to phase shifter 40; address channel 24a connects to deflector 48; data output channel 22a connects to detector 46; and timing channel 26a connects optical switch 38 and detector 46.

Figure 9:
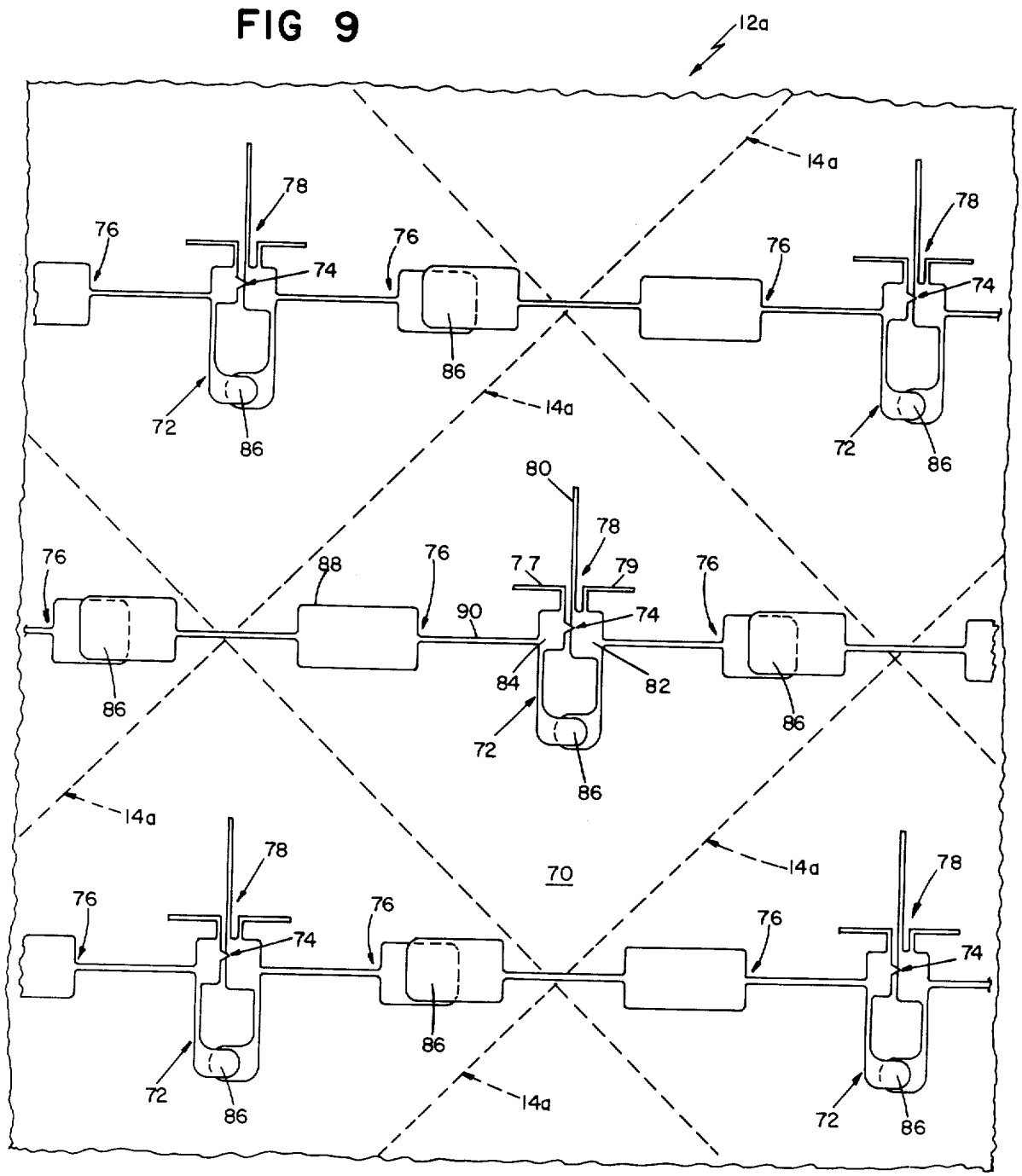
FIG. 9 shows details of a memory cell included in the embodiment of FIG. 8.

Memory bank 12a, as shown particularly in FIG. 9, comprises a two-dimensional array of memory cells formed by layers of metal and dielectric on electrically non-conductive optically transparent substrate 70. As mentioned above, substrate 70 is the flat back surface of sapphire lens 52. The cells are deposited in an orderly two-dimensional array on substrate 70, each individual cell being associated with and identified by an address consisting of two indices corresponding to the x- and y-position of the cell on the substrate.

A typical cell 14a is shown in FIG. 9 together with portions of adjacent cells. Structural elements of the cell are formed by successive deposits on the substrate. In particular, first metallic deposit 82 of aluminum is laid down on substrate 70. Then after the formation of certain dielectric layers which will be described later, second metallic deposit 84 of lead is formed on the substrate, in part overlapping deposit 82. The overlapped areas include broad overlaps 86, which establish low resistance ohmic contact between the successively deposited metal layers, and junction 74 which is much smaller and, as will be discussed more extensively below, has non-ohmic conduction characteristics and is capable of high speed operation. The elements of the deposited structure include junction 74, loop inductive element 72 connected to junction 74, power input antenna 78 with two legs 77, 79, connected respectively to inductive loop 72 on either side of junction 74, control antenna 80, connected to the loop element 72 near junction 74, and biasing connectors 76 with alternating narrow portions 90 and wide portions 88 connecting the elements of cell 14 to similar elements in adjacent cells as shown in FIG. 9.

The dimensions of the various structures of the cell are chosen with regard to the wavelengths of the operating frequencies $f$ and $2f$, taking account of the effect of the substrate in modifying the free space wavelength of the radiation. Antenna 78 thus is formed with a length for half-wave resonance at the frequency $2f$; antenna 80 is formed with a length for quarter-wave resonance at frequency $f$; loop 72 is formed with a length to resonate with the junction capacitance at frequency $f$; wide portion 88 and narrow portion 90 of connector 76 are each of a quarter wavelength at frequency $f$. Consideration should also be given to obtaining an appropriate value of Q for the oscillating circuit keeping in view that a minimum Q is required for oscillation and that switching from one phase to the other requires about Q cycles.

Figure 11:
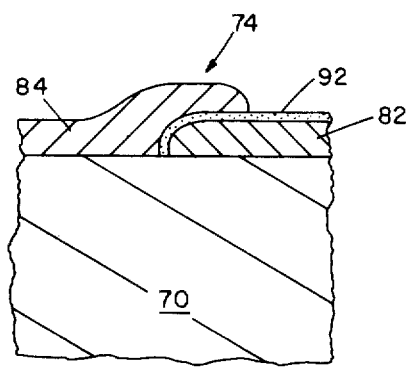

The construction of junction 74 of cell 14a is shown more particularly in a larger scale in FIGS. 10 and 11. First metallic deposit 82 of aluminum is laid down on substrate 70, the deposit having straight edge 94 in the vicinity of the junction. Deposit 82 is about 300 nanometers thick. After the deposit of first metallic layer 82, dielectric layer 92 is formed on top of layer 82 covering the region of junction 74. Layer 92 is formed of aluminum oxide by oxidation of the aluminum layer 82 and has a thickness of about 1 nanometer. (It is desirable that the dielectric formed be thin and nonporous. When a dielectric material is laid down by deposition, it initially forms small islands which grow as deposition continues but do not form a layer free of micro pinholes until the deposit is a few tens of nanometes thick. Layers formed by oxidation, nitridations, etc. of an existing metal layer can in contrast be formed quite free of holes at a thickness of about 1 nm. When exposed to air the oxide layer on aluminum ordinarily grows to a thickness of tens of nonometers. Oxidation of aluminum to form thinner dielectric layers therefore requires limiting available oxygen. Other processing steps must also be conducted without exposure to additional oxygen or materials such as water with loosely bound oxygen. After final processing, a protective, inert, transparent, non-conductive layer such as magnesium flouride may be deposited over the thin oxide layer to stabilize it for use in open air.) Second layer 84 formed of lead with protuberance 96 is then deposited slightly overlapping the edge 94 of layer 82 to form an aluminum-aluminum oxide-lead junction. The thickness of layer 84 is about 300 nanometers and the overlap area is about 1 square micrometer (micron). A structure constructed as described produces a junction having a non-linear current voltage characteristic and capable of responding to infrared optical frequencies as are generated by the $CO_2$ and CO lasers. The use of straight edge 94 on layer 82 and of overlapping protuberance 96 on layer 84 as shown particularly in FIG. 10 permits a relaxed standard for registry between the successively deposited layers in the direction parallel to edge 94, while minimizing the inductive contribution in the electrical path passing through the junction.

Figure 12:
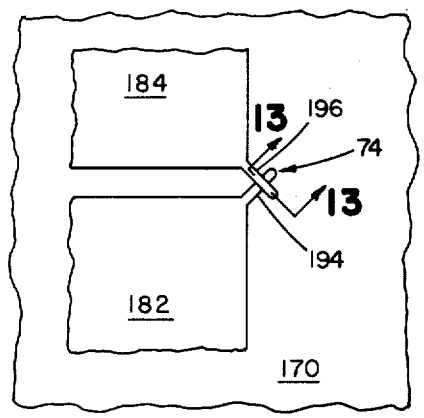
FIGS. 12 and 13 show details of an alternative junction.
Figure 13:
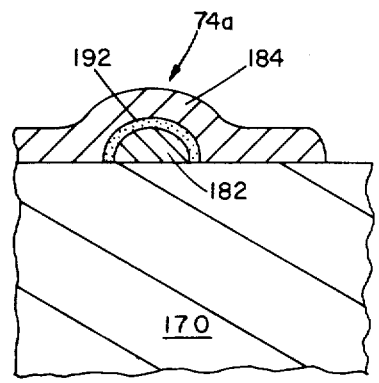

An alternative form of junction construction is shown in FIGS. 12 and 13 where protuberance 196 of layer 184 is overlaid on protuberance 194 of layer 182 after formation of oxide layer 192 to form junction 174. The arrangement of FIGS. 12 and 13 produces relaxed registration tolerances in both directions but involves a somewhat higher inductance in the current passing through the junction It is convenient to explain the operation of this embodiment by first considering the operation of an individual cell. A junction 74 made as described has a non-linear currentvoltage relationship. That is to say, the current $i$ through the junction is given in terms of the voltage $v$ by $$i = a_1 v + a_2 v^2 + \ldots \qquad (1)$$

where $i$ and $v$ are the incremental current and voltage expanded around some d.c. operating point. The coefficient $a_1$, is the ohmic conductance of the junction and is typically 0.01 mho., while the coefficient $a_2$ characterizes the non-linearity of the junction. The junction 74 also has a shunt capacitance C which forms, in combination with the inductance of loop 72, a resonant tank circuit, the dimensions of loop 72 being determined so that the resonance is at frequency $f$. Power antenna 78, which is a half wavelength long (at frequency $2f$), is stimulated by radiation of frequency $2f$ as will be explained hereafter and imposes a voltage of frequency $2f$, across junction 74. Driven by the voltage of frequency $2f$, the tank circuit and junction operate as a subharmonic converter, and the tank circuit oscillates at frequency $f$ producing a voltage across junction 74:

$$v_1 = V_1 \cos{(2 \pi f t \pm \pi/2)}. \qquad (2)$$

where $V_1$ is the amplitude of voltage at frequency $f$. In order to establish the oscillation at frequency $f$ an oscillation threshold condition must be met, namely $$V_2 a_2/a_1 > 1/Q \qquad (3)$$

where $V_2$ is the amplitude of the imposed voltage of frequency $2f$, and $Q$ is the resonance factor of the tank circuit which may typically be about 30. The value of the coefficient $a_2$ depends upon the dc operating point of the junction. Accordingly, a dc biasing current is applied to junction 74 through biasing connectors 76 to enhance non-linear effects. The alternate narrow portions 90 and wide portions 88, each a quarter wavelength long (at frequency $f$) operating to block the transmission of power of frequency $f$ from one cell to another along the biasing connectors. The dc biasing current is advantageously chosen to provide a dc voltage across junction 74 of about 0.3 volt (which gives for $a_2$ a value typically 0.03 mho per volt). The arrangement of wide and narrow portions of loop 72 are advantageously arranged as shown generally in FIG. 9 to direct most of the biasing current through the junction rather than shunting it through the loop.

As indicated by Eqn. 2, the oscillations at frequency $f$ will be stable in either of two operating states characterized by distinct phase relationships. Input-output antenna 80 which is a quarter wave long (at frequency $f$) is connected to loop 72 at a point near junction 74 and will in the absence of incident radiation be stimulated to radiate by the oscillations in loop 72, the radiation having one of two phase characterizations corresponding to the operating state of the loop-junction oscillator. If, however, antenna 80 is subjected to an incident radiation field of frequency $f$ and of a phase corresponding to one of the stable operating states of the oscillator, it will generate currents and voltages of corresponding phase that will couple into the oscillator tank circuit and coerce the oscillations to assume the corresponding phase, with the new phase relation, continuing after the incident radiation on antenna 80 has ended. In other words, radiation incident on antenna 80 will switch the oscillator into one or the other of its two stable states corresponding to the phase of the incident radiation. It may be noted that antenna 80 is oriented at a right angle to antenna 78 and to biasing connectors 76, so that radiation polarized for maximum interaction with antenna 80 will have negligible coupling to antenna 78 or connectors 76.

From the foregoing description it may be seen that the alternative operating states may be used to designate the value of one information bit sotred in the cell, and the phase of the radiation emitted by antenna 80 provides an indication of the stored information while the phase of radiation incident on antenna 80 may be used to enter the bit into the cell.

Considering now the operation of the equipment in its read-out mode, optical switch 38 is off during this mode and memory bank 12 is not illuminated by optical radiation of frequency $f$ from laser 30 as modulated by 31 and 33. The radiation emitted by each of the several antennas 80 is collimated by lenses 52 and 50, so that the radiation from each antenna is emitted from lens 50 in a parallel beam, the bems from the several antennas being directed in different directions depending on the position of the cell. Deflector 48 receives an electrical signal from the central processor on channel 24 indicating the address of a memory cell, the content of which is to be read. The address information will in effect specify the $x$- and $y$-coordinate of the cell of interest. Responsive to the address signal, beam deflector 48 introduces a corresponding deflection in the light coming from the antennas 80 of memory bank so that the beam from the specified cell only is directed by way of beam splitter 42 and 44 to detector 46. In other words the deflector arranges the optics so that the detector looks at the cell specified by the address information it receives on channel 24. The light beam from the specified cell interferes with a reference beam also entering the detector from laser 30 as modulated by 31 and 33 by way of beam splitters 32, 34 and 44. The various path lengths are adjusted so that there will be either constructive or destructive interference depending on the operating state of the cell oscillator and its corresponding phase with corresponding variation of power level reaching the detector. The detector will thus have distinctive responses depending on the state of the specified cell. The response of detector 46 indicating the state of the cell is transmitted back to the central processor on channel 22, where the signal will be interpreted as indicating whether a 0 or 1 was stored in the specified cell.

In the write-in mode of the apparatus, optical switch 38 is open so that radiation from laser 30 as modulted by 31 and 33 passes through phase shifter 40 and beam splitter 42 to deflector 48 and thence through lenses 50, 52 to memory bank 12. As in the read-out mode, deflector 48 responds to an address signal on channel 24 specifying a particular cell and adjusts the optics to direct the beam from laser 30 modulated by 31 and 33 to the specified cell. At the same time the cental processor transmits on channel 20 an electrical signal to phase shifter 40 indicating the value of the information bit to be entered into the specified cell. Phase shifter 40 introduces a corresponding phase shift in the beam from modulated laser 30 so that the radiation incident on the specified cell is phased to be received by antenna 80 and coerce the oscillator of the cell into the corresponding one of its two stable states. The bit value transmitted on channel 20 is thus inserted into the specified memory cell. Control channels 26 from the central processor provide signals which coordinate the operation and prevent confusion during slewing of the deflector and mode changes in accordance with well understood control techniques.

Many variations will be evident within the scope of the invention. Any of a variety of negative impedance devices may be adapted to the embodiments of FIG. 3 or 6 including superconducting Josephson junctions, cryogenic Schottky junctions, and superlattice junctions, or for higher speed operation a deposited parametrically driven oscillator biased just below threshold may be used. Solar cells powered by laser illumination may be also be used to provide operation and bias voltages for memory cells eliminating need for power distribution leads in the cell array.

Further variations and alternative embodiments readily occur to those skilled in the art and are within the scope of the following claims.

I claim:

1. In a memory system having an assembly of memory cells with identifying address values, each cell capable of assuming alternatively either of two states, the states defining the value of information stored in the cell, the improvement comprising in combination an array of memory cells spatially arranged on a substrate in accordance with identifying address values, each cell comprising electrical circuitry having two alternative stable states, and input-output means, connected to said circuitry, said means being responsive to incident optical radiation having two distinct alternative characterizations and producing two alternative electrical effects in correspondence thereto, said means being reponsive to the operating state of said circuitry to emit radiation indicating the operating state of said circuitry, said circuitry being arranged and connected so that when said input-output means is stimulated by directionally-controlled optical radiation having a first of said distinct charcterizations said circuitry assumes a first of said stable states in response to the first of said effects and when said means is stimulated by optical radiation of a second of said characterizations said circuitry assumes a second of said operating states in response to the second of said effects, a radiation processor arranged to send directionally-controlled optical radiation to and receive radiation from said array, said processor having data input, data output, and address input, said processor arranged to operate in a write-in mode generating a beam of optical radiation directed selectively to the one of said cells corresponding to the value of an addressing signal received on said address input, the radiation of said beam having two distinctive alternative characterizations corresponding to the value of a data signal received on said data input, said processor including a radiation receiver arranged to operate in a read-out mode responding selectively to radiation from the one of said cells corresponding to the value of an addressing signal received on said address input and to emit on said data output an electrical signal of value corresponding to the characterization of the received radiation, said radiation processor including a lens system focussing optical radiation on a selected one of said cells, and said array being supported on a surface of a lens of said lens system.

2. In a memory system having an assembly of memory cells with identifying address values, each cell capable of assuming alternatively either of two states, the states defining the value of information stored in the cell, the improvement comprising an array of memory cells spatially arranged on a substrate in accordance with identifying address values, each cell comprising electrical circuitry having two alternative stable states, and input-output means, connected to said circuitry, said means being responsive to incident optical radiation having two distinct alternative characterizations and producing two alternative electrical effects in correspondence thereto, said means being responsive to the operating state of said circuitry to emit radiation indicating the operating state of said circuitry, said circuitry being arranged and connected so that when said input-output means is stimulated by directionally-controlled optical radiation having a first of said distinct characterizations said circuitry assumes a first of said stable states in response to the first of said effects and when said means is stimulated by optical radiation of a second of said characterizations said circuitry assumes a second of said operating states in response to the second of said effects, and means for providing operating power for said cells transmitted thereto by optical radiation, and said substrate being transparent to said incident optical radiation, and said operating power radiation and said radiation of two characterizations being incident on opposite sides of said memory array.

3. A memory system having an array of memory cells spatially arranged on a substrate in accordance with identifying address values, each cell comprising circuitry with an element having a negative resistance characteristic connected in series with a load resistor across a voltage source, said circuitry in the absence of an optically generated input operating stably alternatively at either a first or a second point of its characteristic, said two operating points being associated respectively with the value of information stored in the cell, input means connected to said circuitry and responsive to momentary optical radiation incident at either a first or a second area on said cell, said first and second areas being sufficiently spaced to avoid diffractive interaction, said input means operative in response to momentary incidence of optical radiation on said first area to coerce said circuitry to its first operating point and in response to momentary incidence of optical radition on said second area to coerce said circuitry to its second operating point, and an antenna connected to said circuitry to radiate when said coercion results in switching due to the coerced operating point differing from the operating point prior to coercion thereby to enable determination of the prior operating point.

4. A memory system having an array of memory cells spatially arranged on a substrate in accordance with identifying address values, each cell comprising circuitry with an element having a negative resistance characteristic connected in series with a load resistor across a voltage source, said circuitry in the absence of an optically generated input operating stably alternatively at either a first or a second point of its characteristic, said two operating points being associated respectively with the value of information stored in the cell, input means connected to said circuitry and responsive to momentary optical radiation incident at either a first or a second area on said cell, said first and second areas being sufficiently spaced to avoid diffractive interaction, said input means operative in response to momentary incidence of optical radiation on said first area to coerce said circuitry to its first operating point and in response to momentary incidence of optical radiation on said second area to coerce said circuitry to its second operating point, and output means connected to said circuitry and responsive to incidence of optical radiation at a third area of said cell to emit a signal indicative of the operating point of said circuitry while leaving said operting point unchanged.

5. Apparatus as claimed in claim 4, said output means including an oscillator and an antenna, said oscillator connected to oscillate only when said circuitry is in its first operating point and said third area is illuminated.

* * * * *